May 12, 1970 H. KHAJEZADEH ET AL 3,512,058

HIGH VOLTAGE TRANSIENT PROTECTION FOR AN INSULATED GATE FIELD EFFECT TRANSISTOR

Filed April 10, 1968

INVENTORS
H. KHAJEZADEH &
L.A. JACOBUS, JR.

BY Robert P. Williams
ATTORNEY

United States Patent Office 3,512,058
Patented May 12, 1970

3,512,058

HIGH VOLTAGE TRANSIENT PROTECTION FOR AN INSULATED GATE FIELD EFFECT TRANSISTOR

Heshmat Khajezadeh, Somerville, and Lewis A. Jacobus, Jr., Middlesex, N.J., assignors to RCA Corporation, a corporation of Delaware Filed Apr. 10, 1968, Ser. No. 720,128
Int. Cl. H01l 19/00
U.S. Cl. 317—235 5 Claims

ABSTRACT OF THE DISCLOSURE

A pair of diodes having the same breakdown characteristics are connected in back-to-back relation between the gate electrode and the substrate of an insulated gate field effect transistor to protect the gate insulator against positive or negative overvoltages. The diodes are formed in the substrate of the transistor, and the equivalent breakdown characteristics are provided by forming the diodes as a pair of spaced highly doped regions within a single diffused region in the substrate.

Background of the invention

An insulated gate field effect transistor includes a semiconductive substrate having a planar surface and spaced source and drain regions in the substrate adjacent to the surface to define and make contact to a conductive channel. A layer of insulating material, usually thermally grown silicon dioxide, is disposed on the surface over the channel, and a gate electrode is disposed on the insulating layer in electric field applying relation to the channel. Silicon dioxide has a breakdown strength of about $10^7$ v./cm.; and consequently any transient voltage of about 10 volts per 100 A. of oxide on the gate electrode will probably cause breakdown of the insulator and short circuit the gate to the substrate. Voltages of this magnitude are difficult to avoid. Voltages much higher are often produced by simple electrostatic charge accumulation on the human body, for example.

It has been proposed heretofore to protect an insulated gate field effect device by connecting a diode between its gate electrode and its substrate. The protective diode is arranged to be back-biased during normal operation of the device. When the gate voltage exceeds the breakdown voltage of the diode, conduction from the gate to the substrate will occur and thus the diode provides a limit on the amount of voltage that can be applied to the gate.

Diode protection of this kind can be used for devices operated with gate voltages of one polarity only, since voltages of opposite polarity on the gate would drive the diode in the forward direction. To enable operation with voltages of both polarities, another diode must be added in opposed relation to the first. See Richman, "Characteristics and Operation of MOS Field Effect Devices," McGraw-Hill, New York, 1967, pages 77 to 79. This publication, however, does not disclose how such a back-to-back diode structure could be fabricated.

Summary of the invention

The present device comprises an insulated gate field effect transistor which is protected against overvoltage, and allows operation of the device with gate voltages of both polarities, by back-to-back diodes connected between its gate electrode and its substrate. The back-to-back diodes are formed by a pair of similar spaced regions within a single region in the transistor substrate.

The drawings

The preferred embodiment

Figures 1, 2:
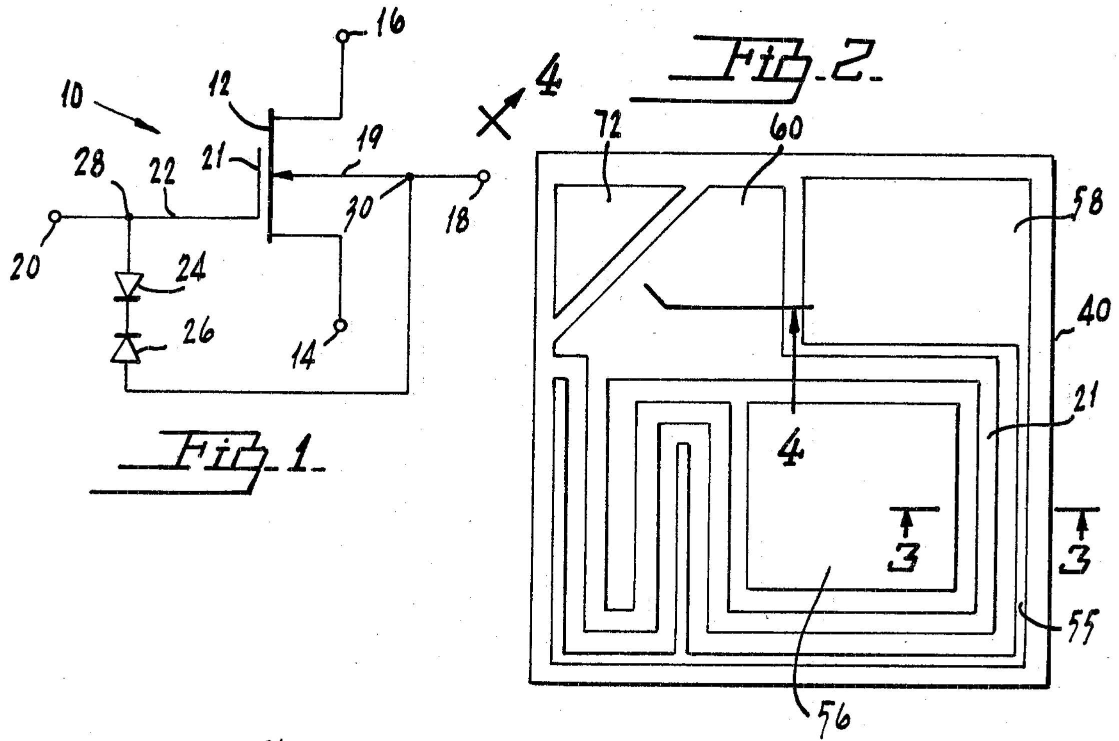
FIG. 1 is a schematic diagram of the equivalent circuit of the present novel transistor.
FIG. 2 is a plan view of a preferred layout for the present novel transistor.

FIG. 1 illustrates in schematic form the electrical equivalent circuit of the present novel transistor. The circuit, indicated generally by the reference numeral 10, includes an insulated gate field effect transistor 12 which has a source terminal 14, a drain terminal 16, a substrate terminal 18 and a gate terminal 20. In the circuit 10, the substrate terminal 18 is connected to the material of the substrate by a lead 19 and the gate terminal 20 is connected to a gate electrode 21 by a lead 22.

Structurally, the gate electrode 21 of the transistor 12 is separated from the substrate of the transistor by a thin insulating layer, ordinarily composed of silicon dioxide. This material has a breakdown strength of about $10^7$ v./cm.

To protect the gate insulating material of the transistor 12 against breakdown due to high gate voltages, the gate electrode 21 is connected to the substrate through a pair of diodes connected in back-to-back relation. Thus, there is one diode 24 and another diode 26 connected in cathode-to-cathode opposed series relation between a terminal 28 on the gate lead 22 and a terminal 30 on the substrate lead 19.

The transistor 12 in FIG. 1 has an N type channel, in this example. Enhancement mode operation results from the application of positive voltage on the gate electrode 21 and depletion mode operation results from negative voltage thereon. In each mode, one or the other of the diodes 24 and 26 will be reverse biased. For example, if these diodes have anodes of P+ type material and cathodes of N type material, the diode 24 will be forward biased but the diode 26 will be reverse biased under enhancement conditions of positive gate voltage. If the gate voltage exceeds the breakdown voltage of the diode 26, current will flow to the substrate. The diode 26 thus limits the positive voltage which can be applied across the gate insulator of the transistor 12.

The situation is reversed for negative voltages on the gate electrode 21. Under these circumstances, the diode 24 is reverse biased while the diode 26 is forward biased. If the voltage on the gate electrode 21 exceeds the breakdown voltage of the diode 24, current again will flow in the circuit between the gate electrode 21 and the substrate, with the result that a limit is established for the amount of negative voltage which can be applied across the gate insulator of the transistor 12.

Figure 3:
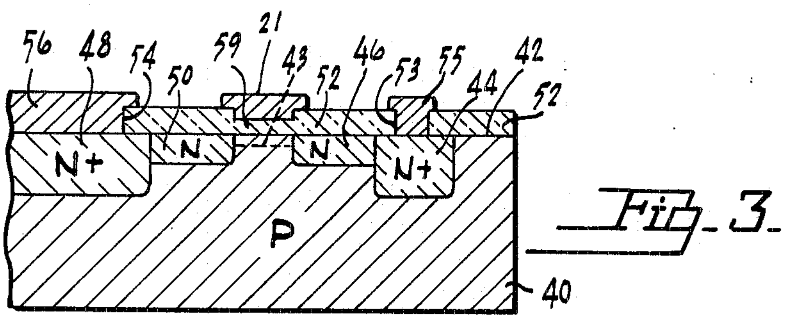
FIG. 3 is an enlarged partial cross sectional view taken on the line 3—3 of FIG. 2.
Figure 4:
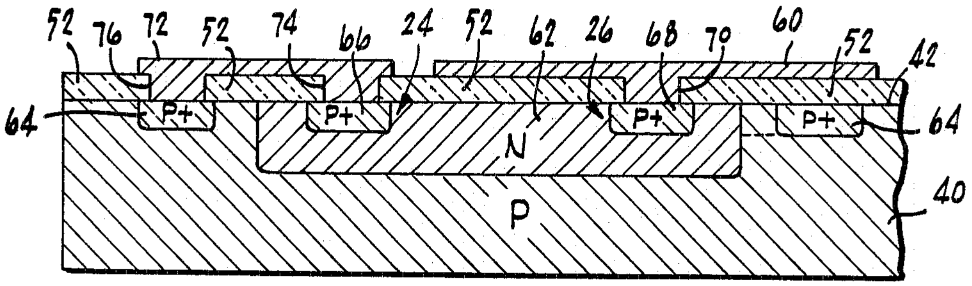
FIG. 4 is an enlarged partial cross sectional view taken on the line 4—4 of FIG. 2.

A preferred structure for the transistor 12 and the diode protection for its gate insulator is illustrated in FIGS. 2 to 4. The transistor 12 is fabricated by known diffusion and photolithographic processes in a substrate body 40 of semiconductive material which is of P type conductivity in this example. The transistor 12 has a channel region 43 adjacent to a surface 42 thereon. The length of the channel region 43 is determined by a pair of spaced source and drain regions. The source region is constituted by a highly doped N+ region 44, near the right side of the structure in FIG. 3 adjacent to the surface 42 of the substrate 40, and an N type region 46 adjacent to the surface 42 between the N+ type region 44 and the channel region 43. The drain region is similarly constituted at the left side of FIG. 3 by an N+ type region 48 and an N type region 50. The purpose of the N+ type regions 44 and 48 is to facilitate ohmic contact to the device, and the purpose of the N type regions 46 and 50 is to establish ohmic contact from the regions 44 and 48 to the channel 43 while keeping the doping level relatively low adjacent to the channel. A more stable operating characteristic is achieved by this expedient.

A layer of insulating material 52 is disposed on the surface 42 of the substrate 40. The insulating layer 52 has openings, indicated at 53 and 54, which are coincident with the N+ type regions 44 and 48 for receiving a metal source electrode 55 and a metal drain electrode 56, respectively. The source electrode 55 extends to a source bonding pad 58, disposed on the insulating layer 52, to which a wire may be bonded to connect the source electrode 55 to external circuitry. A wire may be bonded directly to the drain electrode 56, which is relatively large in area. See FIG. 2.

Adjacent to the channel 43, the insulating layer 52 has a thinner portion 59 which is the active gate insulator of the device. A gate electrode 21 is disposed on the thinner portion 59 of the insulating layer 52 and extends in parallel relation to the source and drain electrodes 55 and 56, as shown in FIG. 2, and terminates in a gate bonding pad 60. The thinner region 58 of the insulating layer 52 may be about 1000 A. thick and will withstand voltage differences between the gate electrode 21 and the substrate 40 of up to about 100 volts without breaking down.

FIG. 4 illustrates the structure of the back-to-back diodes 24 and 26. As shown in FIG. 4, the gate bonding pad 60 overlaps a portion of a diffused N type region 62 in the substrate 40 adjacent to the surface 42. This region acts as a cathode region for both of the diodes 24 and 26. A P+ type diffused region 64 surrounds the N type region 62, in spaced relation from the periphery thereof, and acts as a guard ring to isolate the N type region 62 from the other N type active regions of the device i.e., from that portion of the substrate 40 in which the transistor 12 is formed.

The anodes of the diodes 24 and 26 are constituted by diffused P+ type regions 66 and 68 which are formed within the region 62 adjacent to the surface 42. These regions have substantially the same area, depth, and doping profile so that, with the N type region 62, they form diodes having substantially the same electrical characteristics. The spacings between each of the P+ regions 66 and 68 and between them and the junction between the region 62 and the substrate 40 are made large enough so that PNP transistor action does not take place.

The gate bonding pad 60 is connected to the P+ type region 68 through an opening 70 in the insulating layer 52. The other P+ type reigon 66 is ohmically connected to the P type material of the substrate 40 by means of a metal connection 72 which extends into contact with the P+type region 66 through an opening 74 in the insulating layer 52. The metal connection 72 extends beyond the periphery of the N type region 62 and through an opening 76 in the insulating layer 52 into contact with the P+ type region 64. This region thus serves to facilitate contact to the substrate 40 in addition to its guard ring function.

Because the N type region 62 is disposed below the gate bonding pad 60, the present device occupies about the same area as a device which has no diode protection. The placing of the diodes below a gate bonding pad is especially useful in an insulated gate field effect transistor which has more than one gate electrode and in which at least one gate bonding pad is completely surrounded by other elements, such as a source or a drain region, of the device. In such a transistor, a pair of diodes having a structure as described herein may be conveniently incorporated in the space below each of the bonding pads.

The structure described herein operates in the manner described above with respect to the circuit of FIG. 1. The simultaneous formation of the regions 66 and 68 in the single region 62 so as to have substantially the same structural characteristics provides diodes which have equal electrical characteristics.

In the preferred embodiment described above, the substrate 40 is of P type conductivity and each diode of the pair has a P+, N structure. Such a structure may also be employed in a so-called P channel device as long as the N type common region is isolated from the N type material of the substrate thereof. Moreover, in both N channel and P channel devices, the diodes may be a pair of N+ type regions in a P type common region, with the reservation that the P type common region must be isolated from the P type material of the substrate of an N channel device. Isolation may be achieved, for example, by disposing the common region within an auxiliary region of conductivity type opposite to that of the substrate, thereby introducing a pair of back-to-back junctions between the common region and the substrate.

What is claimed is:

1. An improved insulated gate field effect transistor formed in a semiconductive substrate of one type conductivity having a surface, a layer of insulating material on said surface, and at least one gate electrode disposed on said layer of insulating material in field-applying relation to said channel, wherein the improvement comprises:

- back-to-back diode means for protecting said insulating material against breakdown due to high voltages of either positive or negative polarity on said gate electrode, said diode means comprising,
- a first region, of conductivity type opposite to that of said substrate in said substrate adjacent to said surface, said first region being electrically isolated from that portion of said substrate in which said transistor is formed,
- second and third spaced regions within said first region adjacent to said surface and forming a pair of PN junctions therewith,
- first conductive means connecting said gate electrode to one of said second and third regions, and
- second conductive means connecting the other of said second and third regions to said substrate.

2. An insulated gate field effect transistor as defined in claim 1 further comprising a bonding pad of relatively large area disposed on said layer of insulating material, said gate electrode being connected to said bonding pad and said first region being disposed below and adjacent to said bonding pad.

3. An insulated gate field effect transistor as defined in claim 1 wherein said second and third regions are substantially equal in area, depth of diffusion, and doping profile whereby said junctions have substantially the same electrical properties.

4. An insulated gate field effect transistor as defined in claim 1 wherein said substrate is of P type conductivity said first region is of N type conductivity, and said second and third regions are of P+ type conductivity.

5. An insulated gate field effect transistor as defined in claim 4 wherein the isolation between said first region and the transistor portion of said substrate is provided by a P+ type region in said substrate adjacent to said surface in surrounding relation to said N type first region.

References Cited

UNITED STATES PATENTS 3,403,270 9/1968 Pace et al. ---------- 317—235

OTHER REFERENCES

Characteristics and Operation of MOS Field Effect Devices, by Richman, McGraw-Hill, 1967, pages 77–78.

Custom Microcircuit Design Handbook, by Fairchild Corp., 1963, pages 5–6.

JERRY D. CRAIG, Primary Examiner

U.S. Cl. X.R.

307—304